(12) United States Patent
Shani et al.

(10) Patent No.: US 8,591,072 B2
(45) Date of Patent: Nov. 26, 2013

(54) ILLUMINATION APPARATUS CONFINING LIGHT BY TOTAL INTERNAL REFLECTION AND METHODS OF FORMING THE SAME

(75) Inventors: Yosi Shani, Maccabim (IL); Eran Fine, Tel Aviv (IL); Baruch Schiffmann, Shoham (IL); Dafna Bortman Arbiv, Zichron Yaacov (IL); Avner Badihi, Nataf (IL)

(73) Assignee: Oree, Inc., Ramat Gan (IL)

( * ) Notice: Subject to any disclaimer, the term of this patent is extended or adjusted under 35 U.S.C. 154(b) by 57 days.

(21) Appl. No.: 13/398,951

(22) Filed: Feb. 17, 2012

(65) Prior Publication Data

US 2013/0121001 A1    May 16, 2013

Related U.S. Application Data

(60) Provisional application No. 61/560,293, filed on Nov. 16, 2011.

(51) Int. Cl.
*F21V 8/00* (2006.01)
*F21V 9/16* (2006.01)

(52) U.S. Cl.
USPC .................. 362/296.01; 362/555; 362/84

(58) Field of Classification Search
CPC ........ G02B 6/065; G02B 6/0041; F21K 9/00; G02F 6/0036
USPC ........... 313/500–512, 581–587; 362/84, 97.1, 362/611, 97.2, 97.3; 385/129, 39
See application file for complete search history.

(56) References Cited

U.S. PATENT DOCUMENTS

| | | | |
|---|---|---|---|
| 3,261,356 A | 7/1966 | Wallace | |
| 3,626,471 A | 12/1971 | Florin | |
| 3,871,747 A | 3/1975 | Andrews | |
| 3,995,934 A | 12/1976 | Nath et al. | |
| 4,551,129 A | 11/1985 | Coleman et al. | |
| 4,669,467 A | 6/1987 | Willett et al. | |
| 4,714,983 A | 12/1987 | Lang | |
| 4,762,381 A | 8/1988 | Uemiya et al. | |
| 4,783,140 A | 11/1988 | Osawa et al. | |
| 4,829,192 A | 5/1989 | Kokubu et al. | |
| 4,853,593 A | 8/1989 | Stein et al. | |
| 4,872,837 A | 10/1989 | Issalene et al. | |
| 4,878,072 A | 10/1989 | Reinten | |
| 4,903,172 A | 2/1990 | Schoniger et al. | |
| 4,906,062 A | 3/1990 | Young et al. | |

(Continued)

FOREIGN PATENT DOCUMENTS

CN    2593229    12/2003
CN    1321344    6/2007

(Continued)

OTHER PUBLICATIONS

Allen et al., "A nearly ideal phosphor-converted white light-emitting diode" *Appl. Phys. Ltrs.* 92: 143309 (2008).
Application Brief AB27 for LCD Backlighting Luxeon DCC, Lumileds (2004).

(Continued)

*Primary Examiner* — Tracie Y Green
(74) *Attorney, Agent, or Firm* — Bingham McCutchen LLP

(57) ABSTRACT

In various embodiments, an illumination apparatus includes an air gap between a sub-assembly and a waveguide attached thereto at a plurality of discrete attachment points, as well as a bare-die light-emitting diode encapsulated by the waveguide.

40 Claims, 6 Drawing Sheets

(56) References Cited

U.S. PATENT DOCUMENTS

| | | | |
|---|---|---|---|
| 5,009,483 A | 4/1991 | Rockwell, III | |
| 5,048,913 A | 9/1991 | Glenn et al. | |
| 5,061,032 A | 10/1991 | Meltz et al. | |
| 5,139,420 A | 8/1992 | Walker | |
| 5,152,686 A | 10/1992 | Duggan et al. | |
| 5,165,187 A | 11/1992 | Shahidi-Hamedani et al. | |
| 5,211,467 A | 5/1993 | Seder | |
| 5,281,134 A | 1/1994 | Schultz | |
| 5,425,730 A | 6/1995 | Luloh | |
| 5,535,105 A | 7/1996 | Koenen et al. | |
| 5,559,358 A | 9/1996 | Burns et al. | |
| 5,569,254 A | 10/1996 | Carlson et al. | |
| 5,580,154 A | 12/1996 | Coulter et al. | |
| 5,596,671 A | 1/1997 | Rockwell, III | |
| 5,675,678 A | 10/1997 | Neuberger et al. | |
| 5,718,666 A | 2/1998 | Alarcon | |
| 5,813,752 A | 9/1998 | Singer et al. | |
| 5,813,753 A | 9/1998 | Vriens et al. | |
| 5,847,507 A | 12/1998 | Butterworth et al. | |
| 5,899,552 A | 5/1999 | Yokoyama et al. | |
| 5,947,588 A | 9/1999 | Huang | |
| 5,959,316 A | 9/1999 | Lowery | |
| 5,969,869 A | 10/1999 | Hirai et al. | |
| 6,016,038 A | 1/2000 | Mueller et al. | |
| 6,031,511 A | 2/2000 | DeLuca et al. | |
| 6,079,838 A | 6/2000 | Parker et al. | |
| 6,097,871 A | 8/2000 | De Dobbelaere et al. | |
| 6,155,699 A | 12/2000 | Miller et al. | |
| 6,226,440 B1 | 5/2001 | Lyons | |
| 6,275,512 B1 | 8/2001 | Fermann | |
| 6,278,106 B1 | 8/2001 | Muto et al. | |
| 6,322,225 B1 | 11/2001 | Koike et al. | |
| 6,329,444 B1 | 12/2001 | McGlothlin et al. | |
| 6,345,903 B1 | 2/2002 | Koike et al. | |
| 6,350,041 B1 | 2/2002 | Tarsa et al. | |
| 6,351,069 B1 | 2/2002 | Lowery et al. | |
| 6,356,691 B2 | 3/2002 | Seong-jin et al. | |
| 6,357,889 B1 | 3/2002 | Duggal et al. | |
| 6,408,123 B1 | 6/2002 | Kuroda et al. | |
| 6,417,616 B2 | 7/2002 | Lee | |
| 6,473,554 B1 | 10/2002 | Pelka et al. | |
| 6,488,704 B1 | 12/2002 | Connelly et al. | |
| 6,491,443 B1 | 12/2002 | Serizawa et al. | |
| 6,501,100 B1 | 12/2002 | Srivastava et al. | |
| 6,501,102 B2 | 12/2002 | Mueller-Mach et al. | |
| 6,504,301 B1 | 1/2003 | Lowery | |
| 6,522,065 B1 | 2/2003 | Srivastava et al. | |
| 6,522,794 B1 | 2/2003 | Bischel et al. | |
| 6,527,419 B1 | 3/2003 | Galli | |
| 6,528,755 B2 | 3/2003 | Grewell et al. | |
| 6,530,670 B2 | 3/2003 | Hirayama et al. | |
| 6,549,709 B1 | 4/2003 | De Dobbelaere et al. | |
| 6,551,346 B2 | 4/2003 | Crossley | |
| 6,554,462 B2 | 4/2003 | Hulse et al. | |
| 6,599,000 B2 | 7/2003 | Nolan et al. | |
| 6,608,332 B2 | 8/2003 | Shimizu et al. | |
| 6,614,179 B1 | 9/2003 | Shimizu et al. | |
| 6,621,211 B1 | 9/2003 | Srivastava et al. | |
| 6,635,363 B1 | 10/2003 | Duclos et al. | |
| 6,635,987 B1 | 10/2003 | Wojnarowski et al. | |
| 6,637,924 B2 | 10/2003 | Pelka et al. | |
| 6,654,532 B1 | 11/2003 | Tomaru et al. | |
| 6,671,235 B1 | 12/2003 | Hawryluk et al. | |
| 6,680,004 B2 | 1/2004 | Ono et al. | |
| 6,687,010 B1 | 2/2004 | Horii et al. | |
| 6,694,069 B2 | 2/2004 | Kaneko et al. | |
| 6,709,132 B2 | 3/2004 | Ishibashi | |
| 6,714,711 B1 | 3/2004 | Lieberman et al. | |
| 6,754,408 B2 | 6/2004 | Toda et al. | |
| 6,765,237 B1 | 7/2004 | Doxsee et al. | |
| 6,796,698 B2 | 9/2004 | Sommers et al. | |
| 6,817,735 B2 | 11/2004 | Shimizu et al. | |
| 6,847,170 B2 | 1/2005 | Kayser | |
| 6,850,665 B2 | 2/2005 | Grubsky et al. | |
| 6,853,131 B2 | 2/2005 | Srivastava et al. | |
| 6,871,982 B2 | 3/2005 | Holman et al. | |
| 6,890,234 B2 | 5/2005 | Bortscheller et al. | |
| 6,908,205 B2 | 6/2005 | Greiner | |
| 6,917,057 B2 | 7/2005 | Stokes et al. | |
| 6,939,481 B2 | 9/2005 | Srivastava et al. | |
| 6,941,069 B2 | 9/2005 | Kaneko et al. | |
| 6,943,380 B2 | 9/2005 | Ota et al. | |
| 6,948,829 B2 | 9/2005 | Verdes et al. | |
| 6,965,709 B1 | 11/2005 | Weiss | |
| 6,980,728 B2 * | 12/2005 | Ladstatter et al. | 385/146 |
| 6,982,522 B2 | 1/2006 | Omoto et al. | |
| 7,005,086 B2 | 2/2006 | Matsuno et al. | |
| 7,006,306 B2 | 2/2006 | Falicoff et al. | |
| 7,008,078 B2 | 3/2006 | Shimizu et al. | |
| 7,015,510 B2 | 3/2006 | Srivastava et al. | |
| 7,026,756 B2 | 4/2006 | Shimizu et al. | |
| 7,038,246 B2 | 5/2006 | Uemura | |
| 7,045,826 B2 | 5/2006 | Kim et al. | |
| 7,052,152 B2 | 5/2006 | Harbers et al. | |
| 7,052,153 B2 | 5/2006 | Kawashima et al. | |
| 7,063,450 B2 | 6/2006 | Ehara et al. | |
| 7,066,623 B2 | 6/2006 | Lee et al. | |
| 7,068,898 B2 | 6/2006 | Buretea et al. | |
| 7,071,616 B2 | 7/2006 | Shimizu et al. | |
| 7,086,767 B2 | 8/2006 | Sidwell et al. | |
| 7,123,796 B2 | 10/2006 | Steckl et al. | |
| 7,144,131 B2 | 12/2006 | Rains | |
| 7,153,008 B2 | 12/2006 | Grote, III et al. | |
| 7,168,842 B2 | 1/2007 | Chou et al. | |
| 7,178,941 B2 | 2/2007 | Roberge et al. | |
| 7,178,942 B2 | 2/2007 | Chen et al. | |
| 7,193,248 B2 | 3/2007 | Weindorf et al. | |
| 7,204,607 B2 | 4/2007 | Yano et al. | |
| 7,215,086 B2 | 5/2007 | Maxik | |
| 7,218,824 B2 | 5/2007 | Franklin et al. | |
| 7,221,110 B2 | 5/2007 | Sears et al. | |
| 7,230,222 B2 | 6/2007 | Cheng et al. | |
| 7,251,389 B2 | 7/2007 | Lu et al. | |
| 7,259,403 B2 | 8/2007 | Shimizu et al. | |
| 7,267,787 B2 | 9/2007 | Dong et al. | |
| 7,279,832 B2 | 10/2007 | Thurk et al. | |
| 7,288,797 B2 | 10/2007 | Deguchi et al. | |
| 7,293,906 B2 | 11/2007 | Mok et al. | |
| 7,318,651 B2 | 1/2008 | Chua et al. | |
| 7,331,700 B2 | 2/2008 | Zhang | |
| 7,345,317 B2 | 3/2008 | Reeh et al. | |
| 7,347,586 B2 | 3/2008 | Izardel | |
| 7,350,936 B2 | 4/2008 | Ducharme et al. | |
| 7,367,692 B2 | 5/2008 | Maxik | |
| 7,375,381 B2 | 5/2008 | Shimizu et al. | |
| 7,378,686 B2 | 5/2008 | Beeson et al. | |
| 7,382,091 B2 | 6/2008 | Chen et al. | |
| 7,391,060 B2 | 6/2008 | Oshio | |
| 7,396,142 B2 | 7/2008 | Laizure, Jr. et al. | |
| 7,399,108 B2 | 7/2008 | Ayabe et al. | |
| 7,425,798 B2 | 9/2008 | St.-Germain | |
| 7,430,355 B2 | 9/2008 | Heikenfeld et al. | |
| 7,433,565 B2 | 10/2008 | Joseph et al. | |
| 7,434,940 B2 | 10/2008 | Allman et al. | |
| 7,465,961 B2 | 12/2008 | Masuda et al. | |
| 7,479,733 B2 | 1/2009 | Chang et al. | |
| 7,481,562 B2 | 1/2009 | Chua et al. | |
| 7,513,669 B2 | 4/2009 | Chua et al. | |
| 7,537,947 B2 | 5/2009 | Smith et al. | |
| 7,540,628 B2 | 6/2009 | Awai et al. | |
| 7,585,083 B2 | 9/2009 | Kim et al. | |
| 7,597,470 B2 | 10/2009 | Kurihara et al. | |
| 7,607,815 B2 | 10/2009 | Pang | |
| 7,627,018 B1 | 12/2009 | Guilfoyle et al. | |
| 7,635,203 B2 | 12/2009 | Weaver, Jr. et al. | |
| 7,638,754 B2 | 12/2009 | Morimoto et al. | |
| 7,639,916 B2 | 12/2009 | Fine | |
| 7,654,687 B2 | 2/2010 | Tsai et al. | |
| 7,661,841 B2 | 2/2010 | Kurihara et al. | |
| 7,690,803 B2 | 4/2010 | Miyashita et al. | |
| 7,717,589 B2 | 5/2010 | Nishioka et al. | |
| 7,719,022 B2 | 5/2010 | Maeda | |
| 7,722,211 B2 | 5/2010 | Marra et al. | |
| 7,736,042 B2 | 6/2010 | Park, II et al. | |

(56) References Cited

U.S. PATENT DOCUMENTS

| | | |
|---|---|---|
| 7,736,044 B2 | 6/2010 | Chew et al. |
| 7,738,054 B2 | 6/2010 | Okumura et al. |
| 7,791,683 B2 | 9/2010 | Larson et al. |
| 7,826,698 B1 | 11/2010 | Meir et al. |
| 7,845,839 B2 | 12/2010 | Collier et al. |
| 7,891,852 B2 | 2/2011 | Pugh et al. |
| 7,903,198 B2 | 3/2011 | Abe et al. |
| 7,929,816 B2 | 4/2011 | Meir et al. |
| 7,942,546 B2 | 5/2011 | Naijo et al. |
| 7,991,257 B1 | 8/2011 | Coleman et al. |
| 8,033,706 B1 | 10/2011 | Kelly et al. |
| 8,064,743 B2 | 11/2011 | Meir et al. |
| 2001/0046142 A1 | 11/2001 | Van Santen et al. |
| 2001/0053072 A1 | 12/2001 | Takemoto |
| 2002/0097962 A1 | 7/2002 | Yoshimura et al. |
| 2002/0118907 A1 | 8/2002 | Sugama et al. |
| 2002/0122629 A1 | 9/2002 | Grubsky et al. |
| 2003/0156425 A1 | 8/2003 | Turnbull et al. |
| 2003/0198455 A1 | 10/2003 | Usami |
| 2004/0012556 A1 | 1/2004 | Yong et al. |
| 2004/0156182 A1 | 8/2004 | Hatjasalo et al. |
| 2004/0196648 A1 | 10/2004 | Franklin et al. |
| 2004/0246697 A1 | 12/2004 | Yamashita et al. |
| 2004/0257352 A1 | 12/2004 | Naugler et al. |
| 2005/0041424 A1 | 2/2005 | Ducharme |
| 2005/0088586 A1 | 4/2005 | Mori et al. |
| 2005/0100288 A1 | 5/2005 | Chu |
| 2005/0116667 A1 | 6/2005 | Mueller et al. |
| 2005/0243243 A1 | 11/2005 | Koganezawa |
| 2005/0258432 A1 | 11/2005 | Cho |
| 2005/0265403 A1 | 12/2005 | Anderson et al. |
| 2006/0001036 A1 | 1/2006 | Jacob et al. |
| 2006/0001037 A1 | 1/2006 | Schardt et al. |
| 2006/0002146 A1 | 1/2006 | Baba |
| 2006/0008205 A1 | 1/2006 | Meir et al. |
| 2006/0012286 A1 | 1/2006 | Cull et al. |
| 2006/0092346 A1 | 5/2006 | Moon et al. |
| 2006/0098434 A1 | 5/2006 | Liu et al. |
| 2006/0131924 A1 | 6/2006 | Reck |
| 2006/0164840 A1 | 7/2006 | Song et al. |
| 2006/0170332 A1 | 8/2006 | Tamaki et al. |
| 2006/0193133 A1 | 8/2006 | Von Der Brelie |
| 2006/0203502 A1 | 9/2006 | Stevens et al. |
| 2006/0208670 A1 | 9/2006 | Chang et al. |
| 2006/0221610 A1 | 10/2006 | Chew et al. |
| 2006/0227085 A1 | 10/2006 | Boldt et al. |
| 2006/0262250 A1 | 11/2006 | Hobbs |
| 2006/0262564 A1 | 11/2006 | Baba |
| 2006/0268537 A1 | 11/2006 | Kurihara et al. |
| 2006/0273337 A1 | 12/2006 | Han et al. |
| 2006/0290253 A1 | 12/2006 | Yeo et al. |
| 2007/0019439 A1 | 1/2007 | Yu et al. |
| 2007/0052929 A1 | 3/2007 | Allman et al. |
| 2007/0057626 A1 | 3/2007 | Kurihara et al. |
| 2007/0086211 A1 | 4/2007 | Beeson et al. |
| 2007/0086812 A1 | 4/2007 | Iio et al. |
| 2007/0097321 A1 | 5/2007 | Whitehead et al. |
| 2007/0103914 A1 | 5/2007 | McCaffrey |
| 2007/0133210 A1 | 6/2007 | Watson et al. |
| 2007/0133935 A1 | 6/2007 | Fine |
| 2007/0138966 A1 | 6/2007 | Marka et al. |
| 2007/0147089 A1 | 6/2007 | Lin et al. |
| 2007/0164495 A1 | 7/2007 | Monti |
| 2007/0187710 A1 | 8/2007 | Steen et al. |
| 2007/0188425 A1 | 8/2007 | Saccomanno |
| 2007/0274094 A1 | 11/2007 | Schultz et al. |
| 2007/0284600 A1 | 12/2007 | Shchekin et al. |
| 2007/0297179 A1 | 12/2007 | Leung et al. |
| 2008/0007541 A1 | 1/2008 | Eliasson et al. |
| 2008/0029720 A1 | 2/2008 | Li |
| 2008/0049445 A1 | 2/2008 | Harbers et al. |
| 2008/0055931 A1 | 3/2008 | Verstraete et al. |
| 2008/0061683 A1 | 3/2008 | Bertram |
| 2008/0094348 A1 | 4/2008 | Yin et al. |
| 2008/0122365 A1 | 5/2008 | Decius et al. |
| 2008/0129927 A1 | 6/2008 | Hamada et al. |
| 2008/0144333 A1 | 6/2008 | Gourlay |
| 2008/0151576 A1 | 6/2008 | Inditsky |
| 2008/0174999 A1 | 7/2008 | Chiang |
| 2008/0186736 A1 | 8/2008 | Rinko |
| 2008/0192458 A1 | 8/2008 | Li |
| 2008/0205080 A1 | 8/2008 | Erchak et al. |
| 2008/0212315 A1 | 9/2008 | Cornelissen et al. |
| 2008/0218993 A1 | 9/2008 | Li |
| 2008/0225522 A1 | 9/2008 | Ito |
| 2008/0239749 A1 | 10/2008 | Saccomanno et al. |
| 2008/0251690 A1 | 10/2008 | Keiper et al. |
| 2008/0252571 A1 | 10/2008 | Hente et al. |
| 2008/0297644 A1 | 12/2008 | Farchtchian et al. |
| 2008/0305439 A1 | 12/2008 | Khan |
| 2008/0316605 A1 | 12/2008 | Hazell et al. |
| 2009/0001397 A1 | 1/2009 | Fine et al. |
| 2009/0002668 A1 | 1/2009 | Rohe et al. |
| 2009/0016060 A1 | 1/2009 | Nakao |
| 2009/0027588 A1 | 1/2009 | Medendorp, Jr. et al. |
| 2009/0046453 A1 | 2/2009 | Kramer |
| 2009/0046978 A1 | 2/2009 | Yasuda et al. |
| 2009/0051268 A1 | 2/2009 | You et al. |
| 2009/0052205 A1 | 2/2009 | Chen et al. |
| 2009/0059553 A1 | 3/2009 | Lin |
| 2009/0067194 A1 | 3/2009 | Sanchez |
| 2009/0080830 A1 | 3/2009 | Matsuoka et al. |
| 2009/0116801 A1 | 5/2009 | Fine |
| 2009/0129115 A1 | 5/2009 | Fine et al. |
| 2009/0141476 A1 | 6/2009 | Meir et al. |
| 2009/0151575 A1 | 6/2009 | Eisendrath |
| 2009/0161340 A1 | 6/2009 | Huang et al. |
| 2009/0161341 A1 | 6/2009 | Meir et al. |
| 2009/0161361 A1 | 6/2009 | Meir et al. |
| 2009/0161369 A1 | 6/2009 | Regev et al. |
| 2009/0161383 A1 | 6/2009 | Meir et al. |
| 2009/0162015 A1 | 6/2009 | Meir et al. |
| 2009/0168395 A1 | 7/2009 | Mrakovich et al. |
| 2009/0180276 A1* | 7/2009 | Benitez et al. ............ 362/97.4 |
| 2009/0201955 A1 | 8/2009 | Weigl et al. |
| 2009/0212718 A1 | 8/2009 | Kawashima et al. |
| 2009/0225565 A1 | 9/2009 | Zimmermann et al. |
| 2009/0225566 A1 | 9/2009 | Zimmermann et al. |
| 2009/0236620 A1 | 9/2009 | Park et al. |
| 2009/0250714 A1 | 10/2009 | Yun et al. |
| 2009/0273918 A1 | 11/2009 | Falicoff et al. |
| 2009/0284177 A1 | 11/2009 | Pedersen |
| 2009/0290380 A1 | 11/2009 | Meir et al. |
| 2009/0303412 A1 | 12/2009 | Ake et al. |
| 2009/0310338 A1 | 12/2009 | Negley |
| 2009/0315015 A1 | 12/2009 | Shimizu et al. |
| 2009/0322251 A1 | 12/2009 | Hilgers |
| 2010/0002414 A1 | 1/2010 | Meir et al. |
| 2010/0008628 A1* | 1/2010 | Shani ............................ 385/49 |
| 2010/0014822 A1 | 1/2010 | Fine et al. |
| 2010/0033420 A1 | 2/2010 | Jheng |
| 2010/0045189 A1 | 2/2010 | Storch et al. |
| 2010/0046219 A1 | 2/2010 | Pijlman et al. |
| 2010/0060157 A1 | 3/2010 | Shi |
| 2010/0079841 A1 | 4/2010 | Levola |
| 2010/0098377 A1 | 4/2010 | Meir |
| 2010/0195306 A1 | 8/2010 | Helbing et al. |
| 2010/0201611 A1 | 8/2010 | Duong et al. |
| 2010/0208470 A1 | 8/2010 | Shani et al. |
| 2010/0220484 A1* | 9/2010 | Shani et al. ............ 362/296.09 |
| 2010/0315817 A1 | 12/2010 | Zimmermann |
| 2010/0320904 A1 | 12/2010 | Meir |
| 2011/0013415 A1 | 1/2011 | Meir et al. |
| 2013/0033164 A1* | 2/2013 | Shani ............................ 313/46 |

FOREIGN PATENT DOCUMENTS

| | | |
|---|---|---|
| DE | 19952430 | 5/2001 |
| EP | 0911658 | 10/1998 |
| EP | 1376708 | 1/2004 |
| EP | 1521503 | 4/2005 |
| EP | 1776722 | 4/2007 |
| EP | 1876385 | 1/2008 |
| EP | 1901587 | 3/2008 |

(56) References Cited

FOREIGN PATENT DOCUMENTS

| | | |
|---|---|---|
| EP | 1988752 | 11/2008 |
| EP | 2018089 | 1/2009 |
| GB | 512062 | 8/1939 |
| GB | 2339318 | 1/2000 |
| GB | 2343361 | 5/2000 |
| GB | 2448564 | 10/2008 |
| JP | 5-127158 | 5/1993 |
| JP | 10-247412 | 9/1998 |
| JP | 2004241282 | 8/2004 |
| JP | 2005085718 | 3/2005 |
| WO | WO-96/23649 | 8/1996 |
| WO | WO-97/31219 | 8/1997 |
| WO | WO-99/12400 | 3/1999 |
| WO | WO-01/82657 | 11/2001 |
| WO | WO-02/095289 | 11/2002 |
| WO | WO-03/050448 | 6/2003 |
| WO | WO-03/065201 | 8/2003 |
| WO | WO-2004/017109 | 2/2004 |
| WO | WO-2004/034362 | 4/2004 |
| WO | WO-2004/053531 | 6/2004 |
| WO | WO-2004/100275 | 11/2004 |
| WO | WO-2005/096258 | 10/2005 |
| WO | WO-2005/101070 | 10/2005 |
| WO | WO-2006/131924 A | 12/2006 |
| WO | WO-2007/044472 | 4/2007 |
| WO | WO-2007/055509 | 5/2007 |
| WO | WO-2007/071397 | 6/2007 |
| WO | WO-2007/086657 | 8/2007 |
| WO | WO-2008/013097 | 1/2008 |
| WO | WO-2008/035282 | 3/2008 |
| WO | WO-2008/045311 | 4/2008 |
| WO | WO-2008/053063 | 5/2008 |
| WO | WO-2008/059445 | 5/2008 |
| WO | WO-2008/093267 | 8/2008 |
| WO | WO-2008/100277 | 8/2008 |
| WO | WO-2008/146290 | 12/2008 |
| WO | WO-2008/148927 | 12/2008 |
| WO | WO-2009/130637 | 10/2009 |

OTHER PUBLICATIONS

Beeson et al., "61.5: LED-Based Light-Recycling Light Sources for Projection Displays," *SID Symp. Dig. of Tech. Papers*, 37(1): 1823-1826 (2006).
Fine, "Back Light Modular Unit (BLMu) for large LCD screens", SIL (2006).
International Search Report and Written Opinion for PCT/IL 08/01553, mailed Mar. 25, 2009.
International Search Report and Written Opinion for PCT/IL2006/000667, dated Jun. 10, 2008.
International Search Report for PCT/IL2003/01042, mailed Jul. 29, 2004.
International Search Report for PCT/IL2008/000730, mailed Nov. 25, 2008.
Jones-Bey, "High-Output LEDs: Solid-state lighting seeks a role in pictures," www.laserfocusworld.com/articles (May 21, 2009).
Smith-Gillespie, R., "LCD Backlighting Options and Design Considerations", SID Display Applications Tutorial (May 22, 2008).
Zwanenburg et al., "41.2: High efficiency LEDs for LCD Backlights," *SID 04 Digest*, p. 1222, ISSN/0004-0966X/04/3502-1222 (2004).
International Search Report and Written Opinion for PCT/IL2008/01554, dated May 19, 2009.
"Solid-State Lighting Research and Development: Multi-year Program Plan," U.S. Department of Energy, 162 pages. (Mar. 2010).
ISR and WO for PCT/IL2009/000248, mailed Dec. 14, 2009 (25 pages).
Office Action in Israel Patent Application No. 169122, dated Dec. 22, 2008 (translation).
Tsao et al., "Solid-state lighting: an integrated human factors, technology and economic perspective," Proc. IEEE, pp. 1-18 (Aug. 2009).
International Search Report and Written Opinion mailed Mar. 31, 2011 for PCT/IB2010/052844 (11 pages).
International Search Report and Written Opinion mailed Oct. 11, 2011 for PCT/IB2010/056079 (11 pages).

* cited by examiner

ILLUMINATION APPARATUS CONFINING LIGHT BY TOTAL INTERNAL REFLECTION AND METHODS OF FORMING THE SAME

CROSS-REFERENCE TO RELATED APPLICATION

This application claims priority to and the benefit of U.S. Provisional Patent Application No. 61/560,293, filed on Nov. 16, 2011, the entire disclosure of which is incorporated by reference herein.

FIELD OF THE INVENTION

In various embodiments, the present invention relates to artificial illumination, and in particular to an illumination apparatus confining light therewithin by total internal reflection.

BACKGROUND

Light-emitting diodes (LEDs) are gradually replacing incandescent light bulbs in various applications, including traffic signal lamps, large-sized full-color outdoor displays, various lamps for automobiles, solid-state lighting devices, flat panel displays, and the like. Conventional LEDs typically include a light-emitting semiconductor material, also known as the bare die, and numerous additional components designed for improving the performance of the LED. These components may include a light-reflecting cup mounted below the bare die, a transparent encapsulation (typically silicone) surrounding and protecting the bare die and the light reflecting cup, and electrical leads for supplying the electrical current to the bare die. The bare die and the additional components are efficiently packed in an LED package.

LEDs also represent an attractive alternative light source for general lighting applications and for backlights for liquid crystal displays, where they enable extremely low-thickness (or "low-profile") solutions. One conventional geometry for such illumination solutions is the so-called edge-lit configuration, in which a packaged LED is attached to the shorter, narrow side (or "face") of a waveguide, and the light is emitted through the broader "top" face of the waveguide. Increased coupling efficiencies may be obtained by embedding the bare LED die within the waveguide itself, rather than by separately encapsulating or packaging the die before coupling it to the waveguide. However, since the geometric dimensions of a waveguide typically are far larger than those of the LED die, it is often challenging to achieve and maintain the high coupling efficiency enabled by embedding the bare die while also forming a strong mechanical connection between the various components of the completed system. The LED die is typically mounted on a platform, or a "sub-assembly" that provides mechanical support and electrical connectivity to an external power source. The presence and geometry of the LED sub-assembly may present difficulties when attempting to embed the LED die within the waveguide with high coupling efficiency.

FIGS. 1A (cross-section) and 1B (bottom view) depict an illumination device 100 that features an LED 105 mounted on a sub-assembly 110 and coupled within a recess 115 in a waveguide 120. As shown, the waveguide 120 has the shape of a thin plate with flat top and bottom faces, which may be parallel, as shown, or may be angled toward each other, giving the waveguide 120 the shape of a wedge. Mirrors (or mirror coatings) may be present along the bottom and side faces of waveguide 120. During operation of the illumination device 100, light from the LED 105 is coupled in to an input region 130 of the waveguide 120 via an input coupling element 135. The light then propagates toward an output region 140 by means of total internal reflection (TIR) off of the top and bottom faces of the waveguide 120. (As known to those of skill in the art, TIR depends at least on the refractive-index difference of two materials at the boundary therebetween, as well as the angle of the light impinging upon the boundary.) In the output region 140, the light is out-coupled from the waveguide 120 by, e.g., embedded scattering elements 145 that disrupt the TIR propagation, resulting in emitted light 150.

Devices such as illumination device 100 present an extremely difficult challenge—the need to, within the small thickness of the waveguide 120, convert light not emitted from the LED 105 in the TIR condition into light propagating in waveguide 120 via TIR. This conversion generally must be performed within a very small area in order to prevent additional loss of light from impingements of light on the waveguide faces in non-TIR conditions. This, in turn, constrains the area of the LED sub-assembly 110, as the top face of the sub-assembly 110 generally does not reflect light at TIR conditions and/or may even absorb light from the LED 105, diminishing overall efficiency.

However, for devices such as illumination device 100 to have adequate mechanical stability, the area of the "joint" between the waveguide 120 and the LED sub-assembly 110 is typically much larger than that of the LED die itself, resulting in the above-described efficiency-diminishing area of the sub-assembly surrounding the LED die. This additional sub-assembly area increases the cross-section of contact between the waveguide and the sub-assembly, strengthening the connection, but also results in decreased input coupling efficiency.

FIG. 2 depicts one conventional approach to addressing this trade-off, in which only the "optical connection" (i.e., the proximity enabling in-coupling of light from the LED) between the LED and the waveguide is made in immediate proximity to the LED, and the mechanical support between the waveguide and the sub-assembly is provided separately. As shown, an illumination device 200 features an LED 210 mounted on a larger sub-assembly 220 that is joined to a waveguide 230. The LED 210 is flanked by two mechanical connections 240 that provide mechanical support when the sub-assembly 220 is joined to the waveguide 230. In many such designs, it is recognized that light emitted from the LED in one or more lateral directions (e.g., the indicated x-direction) will not reach the output region even in the absence of mechanical connections that may block or absorb such light. Specifically, much of the light reaching the side faces of the waveguide in such directions will not reach the output region due to their multiple reflections, in the x-direction, in the input-region. Thus, conventional designs may place the mechanical connections 240 in such locations, as light lost via interaction therewith may well not have been efficiently coupled into the bulk of the waveguide anyway; thus, losses associated with the mechanical connections may have little additional impact on the input coupling efficiency.

Exacerbating the impact of mechanical supports on the input coupling efficiency is the fact that the optical connection between the LED and the waveguide is typically achieved via a "dam and fill" process, in which a low-viscosity dam of encapsulant is formed between (and in contact with) the sub-assembly and the waveguide and then filled with higher-viscosity index-matching material. Such processes fill the entire in-coupling region near the LED with the index-matching material, which increases the size of the surrounding region incapable of TIR-based confinement of the LED light (because, since the index-matching material contacts the waveguide and the light-absorbing sub-assembly, light propagating toward the sub-assembly is simply absorbed or otherwise lost rather than reflected into a TIR mode and efficiently in-coupled). Thus, in view of the challenges and disadvantages of conventional waveguide-based illumination devices described above, there is a need for illumination devices having increased mechanical stability without associated in-coupling losses that adversely impact overall efficiency.

SUMMARY

In accordance with various embodiments of the present invention, illumination devices achieve sufficient mechanical stability while also minimizing the contact area between the waveguide and the LED sub-assembly. Rather than utilize a dam-and-fill encapsulation scheme, embodiments of the invention encapsulate the bare LED die either in the waveguide material itself (i.e., with no gaps or other materials therebetween) or in one or more index-matching materials between the LED die and the waveguide material. In the latter case, for example, the LED die may be encapsulated in index-matching material on the LED sub-assembly and then immerse the encapsulated LED die in additional index-matching material (which may be the same as or different from the first index-matching material) present in a recess (and in some embodiments, present only in the recess) in the waveguide. This structure enables the formation of an air gap between the waveguide and the LED sub-assembly during attachment thereof, thereby enabling TIR of light in the waveguide in the vicinity of the sub-assembly. That is, light is confined due to the refractive-index difference between the waveguide and the air gap, rather than being absorbed or otherwise lost via propagation directly into or scattering from a sub-assembly in intimate contact with the waveguide. Furthermore, the index-matching material within the recess may not contact the sub-assembly after immersion of the LED die, thereby maintaining an air gap therebetween across as much area as possible. Thus, the minimized contact area between the LED die and the index-matching material reduces or even substantially eliminates in-coupling losses associated with light propagation to the sub-assembly.

Preferably, the recess in the waveguide has a cross-sectional area and/or volume that is minimized while still accommodating immersion of the LED die therein in order to minimize any "non-TIR region," i.e., a region within the illumination device where in-coupled like is not confined by TIR. The index-matching materials preferably have refractive indices between those of the LED die itself and the waveguide in order to optimize extraction of light from the LED die and coupling of the light into the waveguide. Once the LED die is immersed in the index-matching material in the recess, the surface of the index-matching material surrounding the LED die is preferably substantially parallel to the bottom face of the waveguide, and thereby itself forms a TIR confinement region (also due to the air gap therebelow). Thus, not only does the bottom surface of the waveguide around the recess confine light by TIR, but a portion of the recess itself does as well via the index-matching material.

Preferably, bare LED dies utilized in embodiments of the present invention have rectangular cross-sections with the longer face parallel to the x direction (see FIG. 2), i.e., facing toward the output region of the waveguide. Thus, such LED dies typically emit more light in a desired direction toward the output region.

In an aspect, embodiments of the invention feature an illumination device including or consisting essentially of a waveguide, a sub-assembly attached to a first surface of the waveguide only at a plurality of discrete attachment points, and a bare-die LED mechanically coupled to the sub-assembly and disposed within the waveguide, light emitted by the bare-die LED being in-coupled into the waveguide. An air gap separates the first surface of the waveguide and the sub-assembly between the plurality of discrete attachment points.

Embodiments of the invention include one or more of the following in any of a variety of combinations. A spacer may mechanically couple the bare-die LED to the sub-assembly and raise the bare-die LED above the top surface of the sub-assembly. The waveguide may include a second surface for emitting light emitted by the bare-die LED and propagating within the waveguide. The second surface may be opposite the first surface, and the first and second surfaces may even be substantially planar. Alternatively, the first and second surfaces may be adjoining and not parallel, e.g., substantially perpendicular to each other. An in-coupling element (e.g., a reflector, a prism, and/or one or more scattering elements) for converting light emitted by the bare-die LED from an unconfined mode to a confined mode may be disposed in the waveguide above the bare-die LED. The waveguide may have a second surface opposite the first surface, and a substantially opaque absorber for blocking propagation of light through a second surface of the waveguide may be disposed over the second surface. The absorber may be attached to the second surface only at a second plurality of discrete attachment points; an air gap may thus be disposed between the second surface of the waveguide and the absorber between the second plurality of discrete attachment points.

An adhesive material (e.g., a flexible adhesive) may be disposed at each of the plurality of discrete attachment points. The waveguide may define a plurality of protrusions from the first surface; each of the protrusions may be disposed at one of the discrete attachment points, and the maximum height of the protrusions above the first surface may be approximately equal to the thickness of the air gap. A plurality of discrete separators may be disposed between the first surface and the sub-assembly; each of the separators may be disposed at one of the discrete attachment points, and the thickness of the separators may be approximately equal to a thickness of the air gap. Each separator may be attached to the first surface and/or to the sub-assembly with an adhesive material. At least one discrete attachment point may be disposed on a relief defined by at least one relief trench extending through the thickness of the sub-assembly. The relief may be elastically deformable in at least a first direction substantially perpendicular to the first surface, and the relief may even be elastically deformable in a second direction substantially perpendicular to the first direction. At least one discrete attachment point may not be disposed on a relief and may thereby not be elastically deformable. The plurality of discrete attachment points may be disposed in a line substantially perpendicular to a propagation direction extending from the bare-die LED to an output region of the waveguide (e.g., a portion of the second surface of the waveguide spaced away from the bare-die LED and any recess in the waveguide).

The waveguide may define a recess in the first surface, and the bare-die LED may be disposed within the recess. At least one index-matching material may fill at least a portion of the recess and encapsulate the bare-die LED, thereby facilitating in-coupling of light emitted by the bare-die LED into the waveguide. A free surface of at least one of the index-matching materials in the recess may be spaced away from the sub-assembly, thereby defining a second air gap between the sub-assembly and the free surface. The free surface may be substantially parallel to the first surface of the waveguide. In a propagation direction extending from the bare-die LED to an output region of the waveguide, a dimension of the recess may be no more than three times (or no more than two times, or even approximately equal to) a dimension of the bare-die LED in the propagation direction.

In another aspect, embodiments of the invention feature a method of forming an illumination device incorporating a bare-die LED mechanically coupled to a sub-assembly. The sub-assembly is attached to a first surface of a waveguide at only a plurality of discrete attachment points, thereby defining an air gap disposed between the first surface of the waveguide and the sub-assembly between the plurality of discrete attachment points. The bare-die LED is encapsulated within a recess defined by the waveguide in the first surface, thereby facilitating in-coupling of light emitted by the bare-die LED into the waveguide.

Embodiments of the invention include one or more of the following in any of a variety of combinations. Encapsulating the bare-die LED may include or consist essentially of at least partially surrounding the bare-die LED with at least one index-matching material. At least one such index-matching material may be disposed within the recess before the sub-assembly is attached to the first surface of the waveguide. Encapsulating the bare-die LED may include or consist essentially of at least partially surrounding the bare-die LED with a first index-matching material prior to attachment of the sub-assembly to the first surface of the waveguide, disposing a second index-matching material within the recess prior to attachment of the sub-assembly to the first surface of the waveguide, and at least partially surrounding the bare-die LED and a portion of the first index-matching material with the second index-matching material during attachment of the sub-assembly to the first surface of the waveguide. At least one discrete attachment point may be disposed on a relief defined by at least one relief trench extending through the thickness of the sub-assembly. The relief may be elastically deformable in at least a first direction substantially perpendicular to the first surface, and the relief may even be elastically deformable in a second direction substantially perpendicular to the first direction. At least one discrete attachment point may not be disposed on a relief and may thereby not be elastically deformable. Attaching the sub-assembly to the first surface of the waveguide may include or consist essentially of forming the plurality of discrete attachment points via dispersal of an adhesive between the sub-assembly and the waveguide at each of the discrete attachment points.

In yet another aspect, embodiments of the invention include a method of forming an illumination device incorporating a bare-die LED. The bare-die LED is encapsulated within a waveguide by disposing the bare-die LED within a waveguide material such that the waveguide material directly contacts, without a gap therebetween, either the bare-die LED or an index-matching material disposed around and in direct contact with the bare-die LED.

Embodiments of the invention include one or more of the following in any of a variety of combinations. A sub-assembly may be attached to a first surface of the waveguide at only a plurality of discrete attachment points, thereby defining an air gap disposed between the first surface of the waveguide and the sub-assembly between the plurality of discrete attachment points. The waveguide may define a plurality of protrusions from the first surface, each protrusion being disposed at one of the discrete attachment points; the maximum height of the protrusions above the first surface may be approximately equal to the thickness of the air gap. The waveguide and the sub-assembly may be brought into contact at the plurality of discrete attachment points substantially simultaneously with the bare-die LED being encapsulated within the waveguide. At least one discrete attachment point may be disposed on a relief defined by at least one relief trench extending through the thickness of the sub-assembly. The relief may be elastically deformable in at least a first direction substantially perpendicular to the first surface, and the relief may even be elastically deformable in a second direction substantially perpendicular to the first direction. At least one discrete attachment point may not be disposed on a relief and may thereby not be elastically deformable. The bare-die LED may be encapsulated substantially simultaneously with formation of the waveguide. The index-matching material may be disposed around the bare-die LED prior to encapsulating the bare-die LED within the waveguide.

These and other objects, along with advantages and features of the present invention herein disclosed, will become more apparent through reference to the following description, the accompanying drawings, and the claims. Furthermore, it is to be understood that the features of the various embodiments described herein are not mutually exclusive and may exist in various combinations and permutations. As used herein, the terms "substantially" and "approximately" mean ±10%, and in some embodiments, ±5%, unless otherwise indicated. The term "consists essentially of" means excluding other materials or structures that contribute to function, unless otherwise defined herein.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION

Figure 3:
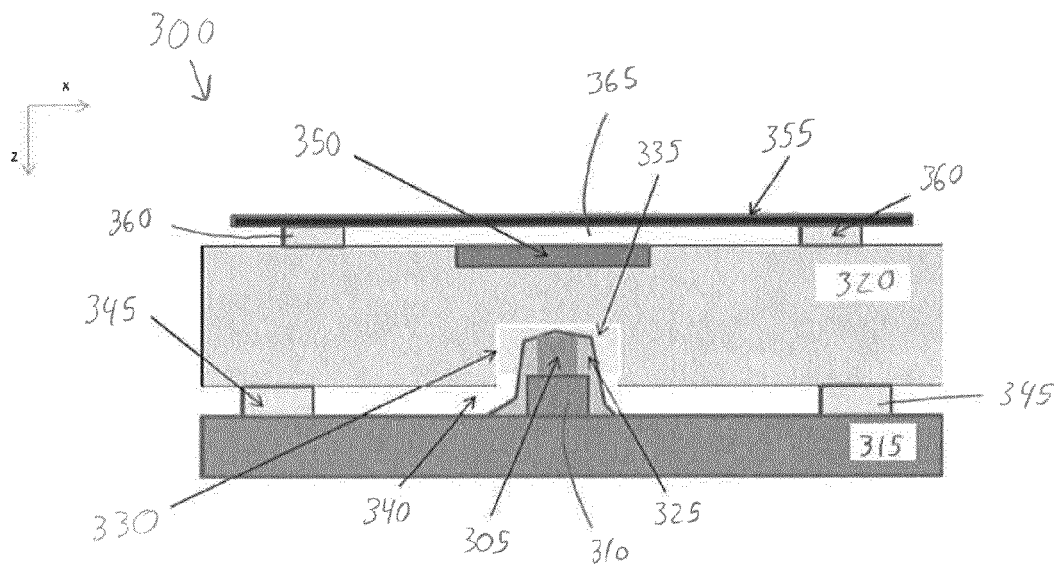
FIGS. 3-5 are cross-sectional views of illumination devices having one or more LEDs optically coupled within a waveguide in accordance with various embodiments of the present invention.

FIG. 3 depicts an illumination device 300 in accordance with embodiments of the present invention. As shown, illumination device 300 includes one or more bare LED dies 305 mounted on a spacer 310 on an LED sub-assembly 315. The spacer (which may be different and discrete from the sub-assembly 315, or may simply be a raised portion thereof) elevates the LED die 305 above the plane of the sub-assembly 315, which is preferably otherwise substantially planar, thus facilitating the optical connection between the LED 305 and a waveguide 320. The waveguide 320 is preferably substantially optically transparent, but may also incorporate various features (e.g., scatterers, reflectors, etc.) for the in-coupling, reflection, and out-coupling of light confined therein. The waveguide 320 may include or consist essentially of one or more polymeric materials, e.g., latex, polyvinylchloride, nitrile, chloroprene (Neoprene), poly(cis-isoprene), poly(2, 3-dimethylbutadiene), poly(dimethylsiloxane), ethylene/vinyl acetate copolymer -40% vinyl acetate, ethylene/vinyl acetate copolymer-30% vinyl acetate, poly(butadiene-co-acrylonitrile), natural rubber, poly(chloroprene), polymethylmethacrylate, and/or polycarbonate. The sub-assembly 315 may include or consist essentially of one or more suitably rigid materials, e.g., a printed circuit board (PCB) or a metal-core PCB.

In various embodiments of the present invention, the LED die 305 is encapsulated with an index-matching material 325 prior to the connection of sub-assembly 315 with waveguide 320. The index-matching material 325 preferably has an index of refraction between those of the LED die 305 and the waveguide 320 in order to facilitate light extraction from the LED die 305 and in-coupling of the light into the waveguide 320. The index-matching material 325 may also advantageously cover any wires, other electrical connections, contact pads, and the like, and may thus protect such elements from damage and/or elemental exposure. As shown, the index-matching material 325 may additionally coat at least a portion (or even substantially all of) the spacer 310, and may even coat portions of the sub-assembly 315 surrounding the spacer 310. Index-matching material 325 may be dispensed over the LED die 305 in liquid or gel form, and then partially or fully cured before sub-assembly 315 is connected to the waveguide 320.

In various embodiments of the invention, once the LED die 305 is encapsulated with the index-matching material 325, LED die 305 is positioned into a recess (or "cavity") 330 in the waveguide 320, and a high-coupling-efficiency optical connection between the LED die 305 and the waveguide is enabled via an index-matching material 335. The index-matching material 335 may include or consist essentially of the same material as index-matching material 325, or it may be a different material. For example, the index of refraction of index-matching material 335 may be between those of index-matching material 325 and waveguide 320. Index-matching materials 325, 335 may each (or both) include or consist essentially of, e.g., silicone and/or epoxy.

In one embodiment of the invention, the index-matching material 335 is dispensed into the recess 330 prior to the LED die 305 being positioned therein. The waveguide 320 may be positioned with the recess 330 opening upwards, and may be positioned such that the bottom surface of the waveguide 320 is substantially perpendicular to the force of gravity. Thus, once the LED die 305 is positioned within the recess 330, the index-matching material 335 settles such that the surface thereof is substantially parallel to the bottom surface of the waveguide 320 (i.e., the surface of the waveguide 320 in which the recess 330 is formed). The sub-assembly 310 is then positioned proximate the waveguide 320 such that the LED die 305 is positioned within the recess 330 and surrounded (at least light-emitting portions thereof) by the index-matching material 335. The index-matching material 335 may initially be dispensed in a liquid or gel form and may be fully or partially cured once LED die 305 is positioned therewithin. As mentioned, after the optical connection of LED die 305 into the waveguide 320 (via the index-matching material 335), the exposed surface of the index-matching material 335 is preferably substantially parallel to the bottom surface of the waveguide 320 and spaced away from the sub-assembly 315. As shown in FIG. 3, the exposed surface of the index-matching material 335 is not necessarily coplanar with the bottom surface of the waveguide 320 (thus substantially filling the recess 330), but in some embodiments it is coplanar therewith.

In an alternative embodiment of the invention, the LED die 305 is positioned within a substantially empty recess 330 by bringing the sub-assembly 315 proximate the waveguide 320. Then, the index-matching material 335 may be injected into the partially occupied recess 330, surrounding the LED die 305. As described above, the index-matching material 335 may be dispensed as a liquid or gel and partially or fully cured afterwards. Also, after the index-matching material 335 is injected around the LED die 305, the exposed surface of the index-matching material is preferably substantially parallel to the bottom surface of the waveguide 320 and spaced away from the sub-assembly 315, as described above.

In some embodiments of the invention, as shown in FIG. 3, the LED die 305 is positioned within the recess 330 substantially spaced away from the walls and the surface of the waveguide 320 disposed above the LED die 305 and defined by recess 330. In other embodiments the top surface of LED die 305 (or the index-matching material 325, if present on the top surface of LED die 305) is in direct contact with the surface of waveguide 320 within the recess 330; thus, light emitted from the top surface of the LED die 305 is coupled directly into the waveguide 320 without necessarily traversing index-matching material. In either type of embodiment there is preferably no empty gap between a light-emitting portion of the LED die 305 and the waveguide 320—such space is either nonexistent or filled with one or more index-matching materials.

Figure 1:
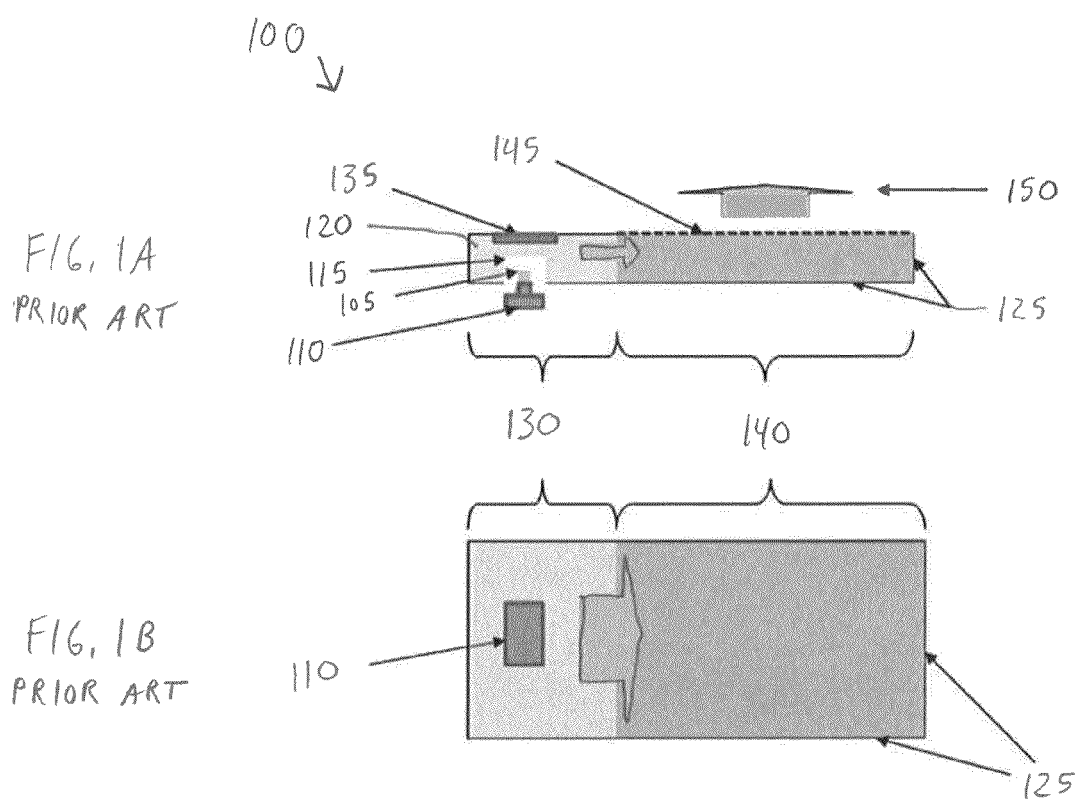
FIGS. 1A and 1B are a cross-section and a bottom view, respectively, of an LED-based illumination device.
Figure 2:
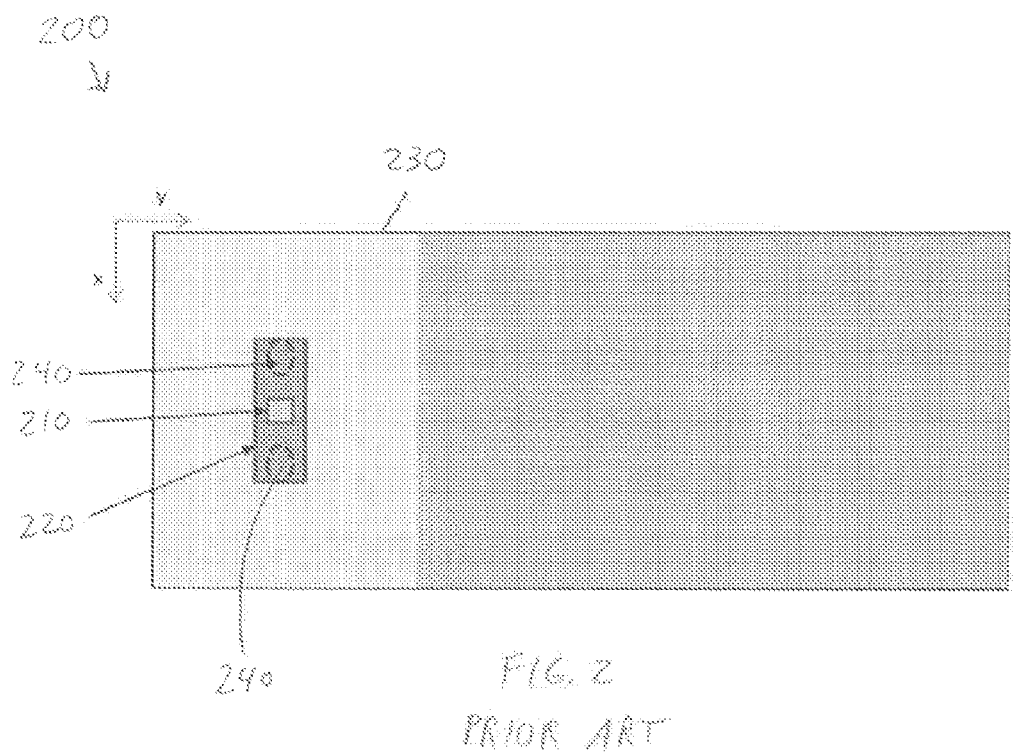
FIG. 2 is a plan view of an LED-based illumination device.

Preferably, TIR within the waveguide 320 in the proximity of LED die 305 and sub-assembly 315 is facilitated by the attachment of waveguide 320 to sub-assembly 315 such than an air gap 340 is formed and maintained therebetween. TIR in this region of the waveguide 320 enables the confinement of light within the waveguide 320, thereby increasing the input coupling efficiency of illumination device 300 (i.e., the amount of light emitted by LED die 305 that is successfully confined within the waveguide 320). The air gap 340 may have a thickness in the range of, e.g., approximately 1 μm to approximately 1000 μm. In order to attach the sub-assembly 315 to the waveguide 320 with sufficient mechanical stability but while maintaining the air gap 340, one or more regions of an adhesive 345 may be disposed between the two parts. The adhesive 345 is preferably spaced away from the recess 330 and/or shaped to have a fairly small area of contact with the waveguide 320, thereby minimizing any absorptive and/or scattering losses resulting from interaction of the light in the waveguide 320 with the adhesive 345. The adhesive 345 may have an index of refraction smaller than that of the waveguide 320 in order to help facilitate TIR within the waveguide 320 in the vicinity of adhesive 345. The adhesive 345 may be disposed in one or more regions substantially perpendicular to the intended light path from the LED die 305 to the emission surface of the waveguide 320, e.g., as shown for the reinforcements in FIG. 2.

Illumination device 300 may also incorporate one or more in-coupling elements 350 disposed above the recess 330 (and preferably proximate or even at the surface of waveguide 320 opposite recess 330). The in-coupling element 350 may include or consist essentially of, e.g., a reflector (which may be planar and/or curved), a prism, or one or more scattering elements such as bubbles or surface features such as hemispheres. In-coupling element 350 facilitates the in-coupling of light emitted by the LED die 305 into the bulk of the waveguide 320 by redirecting one or more portions of light not already propagating therewithin in a TIR condition.

Because the in-coupling element 350 (and/or other portions of the waveguide 320) may be an imperfect reflector and/or may allow some finite amount of light to propagate therethrough, the illumination device 300 may also incorporate an absorber 355 that absorbs and/or reflects such light, thereby preventing its escape into the surrounding ambient. The absorber is preferably substantially opaque and may include or consist essentially of, e.g., one or more metallic, plastic, and/or ceramic materials. As with the attachment of the sub-assembly 315 to waveguide 320, the absorber 355 may be attached via, e.g., one or more regions of an adhesive 360 (which may be the same as or different from adhesive 345) such that an air gap 365 is formed and maintained between waveguide 320 and absorber 355. The air gap 365 may have a thickness in the range of, e.g., approximately 1 µm to approximately 1000 µm, and it facilitates the TIR confinement of light within the waveguide 320. A center portion of absorber 355 disposed directly over the recess 330 and/or LED die 305 may be substantially reflective to reflect light back into waveguide 320. As described above for adhesive 345, the adhesive 360 may be disposed in one or more regions substantially perpendicular to the intended light path from the LED die 305 to the emission surface of the waveguide 320, e.g., as shown for the reinforcements in FIG. 2.

In some embodiments of the invention the waveguide 320 has a coefficient of thermal expansion (CTE) different from that of the sub-assembly 315 and/or the absorber 355. In such embodiments, the index-matching materials 325, 335 and/or the adhesives 345, 360 may be selected to mitigate at least a portion of the CTE mismatch between the various components of illumination system 300. For example, either or both of adhesives 345, 360 may be substantially flexible, and any of adhesives 345, 360 and/or index-matching materials 325, 335 may be at least partially gelatinous to thereby absorb CTE-mismatch stresses and prevent the debonding of waveguide 320 from sub-assembly 315 and/or absorber 355. Embodiments of the invention may incorporate other features to reduce CTE-mismatch stresses, as described below with reference to FIGS. 6-9.

Figure 4:
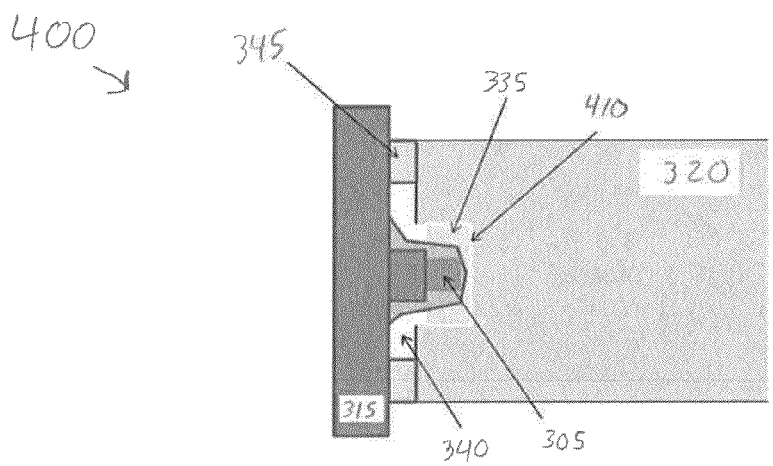

As shown in FIG. 4, embodiments of the invention feature LED dies 305 "edge-coupled" into waveguide 320, i.e., optically connected to a face of waveguide 320 that adjoins (i.e., is not opposite) the top, light-emitting surface thereof. In FIG. 4, an illumination device 400 features an LED die 305 optically connected to the waveguide 320 via index-matching material 335 disposed within an edge recess 400, substantially as described above for recess 330.

Figure 5:
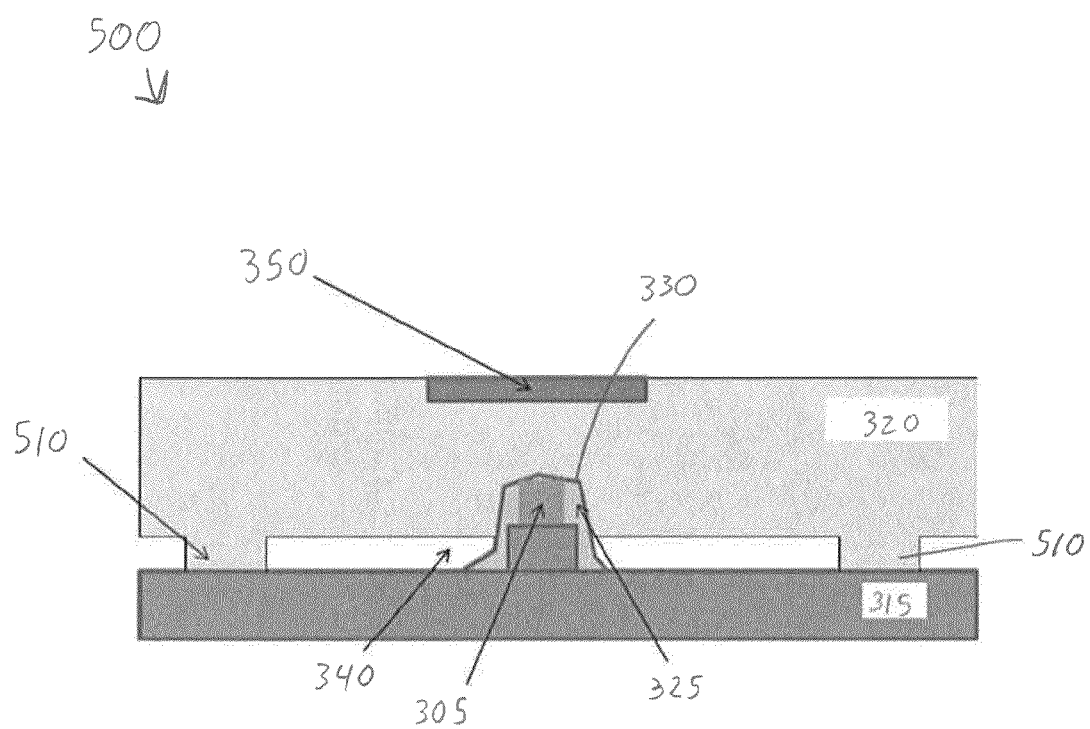

FIG. 5 depicts an exemplary illumination device 500 in which the adhesive 345 is replaced with or supplemented by one or more protrusions 510 that are intimate portions of and protrude from the body of waveguide 320, thereby facilitating formation and maintenance of the air gap 340 when waveguide 320 is attached to the sub-assembly 315. In other embodiments of the invention, the protrusions 510 are portions of and protrude from the sub-assembly 315 (in addition to or instead of protruding from waveguide 320). As shown for the reinforcements in FIG. 2, the protrusions 510 may be disposed in one or more regions substantially perpendicular to the intended light path from the LED die 305 to the emission surface of the waveguide 320. In some embodiments, the protrusions 510 are supplemented or replaced by discrete separators at the attachment points. For example, both the waveguide 320 and the sub-assembly 315 may be substantially planar in the vicinity of the attachment points, and the separators may be attached to both the waveguide 320 and sub-assembly 315 at those points by, e.g., an adhesive. In such cases the thickness of the separators generally defines the thickness of the air gap 340. In other embodiments, either (or both) of the sub-assembly 315 or waveguide 320 may incorporate protrusions 510 that have a thickness smaller than that of the desired air gap 340, and discrete separators are utilized with (and, e.g., adhered to) those protrusions to increase the size of the air gap 340. The separators may include or consist essentially of any suitably rigid material, e.g., one or more of the materials of sub-assembly 315, spacer 310, or waveguide 320.

As also shown in FIG. 5, the waveguide 320 may be formed directly around the LED die 305 and/or the index-matching material 325 (if present); thus, the bare LED die 305 or the LED die encapsulated by index-matching material 325 is encapsulated by the waveguide material itself. For example, the waveguide 320 may be initially formed, e.g., by injection molding, such that it at least partially surrounds LED die 305, or the LED die 305 may be placed within the waveguide material while the waveguide material is in a liquid or gelatinous state, whereupon the material is cured to form waveguide 320 encapsulating the LED die 305. In such embodiments, the bare LED die 305 may have disposed thereupon a layer of index-matching material 325 (as depicted in FIG. 5) or may be disposed in direct contact (i.e., with no intervening gaps or other materials) with the waveguide 320, which may then not define therewithin any other sort of recess.

Figure 6:
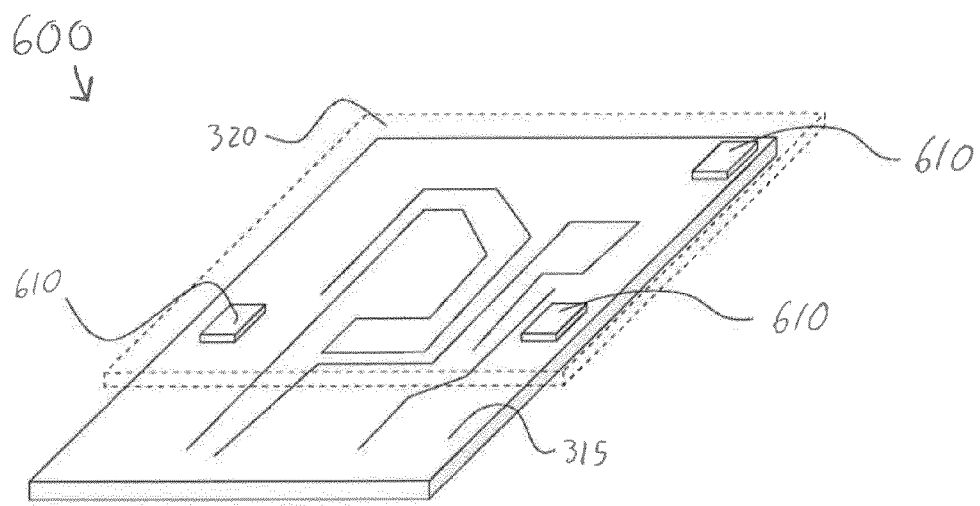
FIG. 6 is a perspective view of an illumination device in accordance with various embodiments of the present invention.

Embodiments of the present invention may also incorporate various features to minimize the impact of CTE mismatch between various components. As shown in FIG. 6, an exemplary illumination device 600 may include or consist essentially of a sub-assembly 315 attached to a waveguide 320 via two or more joining elements 610. (Features such as LED die 305 and recess 330 are not shown in FIGS. 6-9 for clarity but may be present as detailed above.) The joining elements 610 may include or consist essentially of, e.g., adhesive 345 and/or protrusions 510 as described above. The sub-assembly 315 and the waveguide 320 typically have different CTEs, and there is thus a finite amount of CTE mismatch therebetween that may result in deleterious stresses or even debonding during or after thermal cycles experienced by illumination device 600. As described above regarding FIGS. 3 and 4, the sub-assembly 315 and the waveguide 320 are typically in contact only at the joining elements 610 and there is otherwise an air gap between sub-assembly 315 and waveguide 320.

The CTE mismatch between the sub-assembly 315 and the waveguide 320 may arise due to these elements comprising or consisting of different materials, as mentioned above. For example, the sub-assembly 315 may include or consist essentially of a PCB or a material (such as a ceramic material) utilized in the formation of PCBs, and may thus have a CTE in the range of approximately 15 to 17 ppm/° C. Sub-assembly 315 may even include a metal plate, and may include or consist essentially of a metal-core PCB, where the metal may be, e.g., aluminum (having a CTE of approximately 24 ppm/° C.) and/or copper (having a CTE of approximately 18 ppm/° C.). In contrast, the waveguide 320 may include or consist essentially of, e.g., polymethylmethacrylate (PMMA), which has a CTE of approximately 70 ppm/° C.).

In a non-limiting exemplary embodiment presented to demonstrate potential CTE mismatch-related issues, the CTE-related stress experienced in an illumination device 600 (generally at the two or more joining elements 610) may be calculated. In the exemplary embodiment, the sub-assembly 315 has a $CTE_{SA}$ of approximately 24 ppm/° C. and the waveguide 320 has a $CTE_W$ of approximately 70 ppm/° C. For example, if a distance L between two joining elements 610 is 24 mm, then for a temperature change $\Delta T$ of 80° C., the difference in linear expansion $\Delta L$ between the two elements corresponds to:

$$\Delta L=(CTE_W-CTW_{SA})\times\Delta T\times L=88 \text{ μm}.$$

The resulting stress a in the waveguide 320, which has a Young's modulus $E_W$ of, e.g., 3.2 Gigapascals (GP), corresponds to:

$$\sigma=(\Delta L/L)\times E_W=11.7 \text{ Megapascals (MP)}.$$

Assuming that the two joining elements 610 in question have surface areas S of approximately 6 mm$^2$, then the force experienced at the joining elements 610 (and also the waveguide 320) corresponds to $F=\sigma\times S=$approximately 70 Newtons (N).

Figure 7:
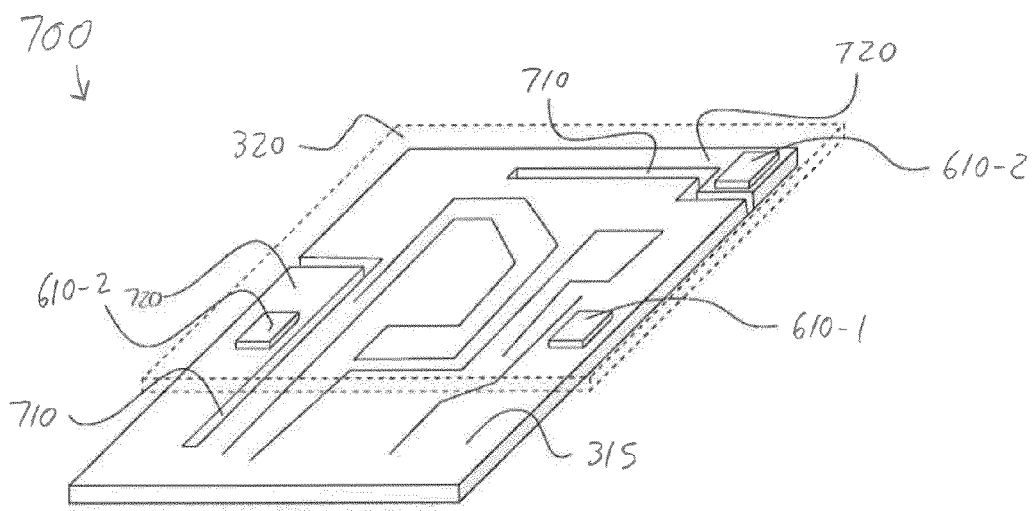
FIGS. 7-9 are perspective views of illumination devices incorporating features to reduce thermally induced stresses in accordance with various embodiments of the present invention.

As shown in FIG. 7, embodiments of the invention advantageously incorporate features to mitigate CTE-mismatch stresses. In accordance with various embodiments, an illumination device 700 includes sub-assembly 315 and waveguide 320, similar to illumination device 600 described above. As in illumination device 600, the sub-assembly 315 and waveguide 320 are attached at two or more joining elements 610, indicated in FIG. 7 as joining elements 610-1 and 610-2. As shown, illumination device 700 features one or more release trenches 710 (that preferably extend through the thickness of sub-assembly 315), thereby forming reliefs 720 on which one or more joining elements 610-2 are disposed The reliefs 720 remain connected to the bulk of the sub-assembly 315 along one dimension and at at least one point, but are substantially free to move along other dimensions (i.e., dimensions perpendicular to the direction of connection) and thus provide compliancy to the connection between sub-assembly 315 and waveguide 320. The reliefs 720 may be free to move elastically and may therefore be considered to be elastic springs that act to relieve CTE-mismatch stress during thermal cycles.

In order to maintain the alignment between sub-assembly 315 and waveguide 320, at least one joining element 610 (indicated as joining element 610-1) is maintained as a substantially rigid connection, i.e., a relief 720 is not formed thereunder. The beneficial impact of the reliefs 720 may be calculated utilizing many of the same exemplary values utilized above in relation to FIG. 6. For a relief having a length d of 10 mm a width w of 1.5 mm, and a thickness b of 1.3 mm, for the above-calculated displacement between joining elements 610 of 88 μm, the force induced at the end of the relief (and thus experienced at the joining element 610) is only approximately 5 N, a much smaller value than the 70 N experienced in the absence of the relief trenches 710.

Figure 8:
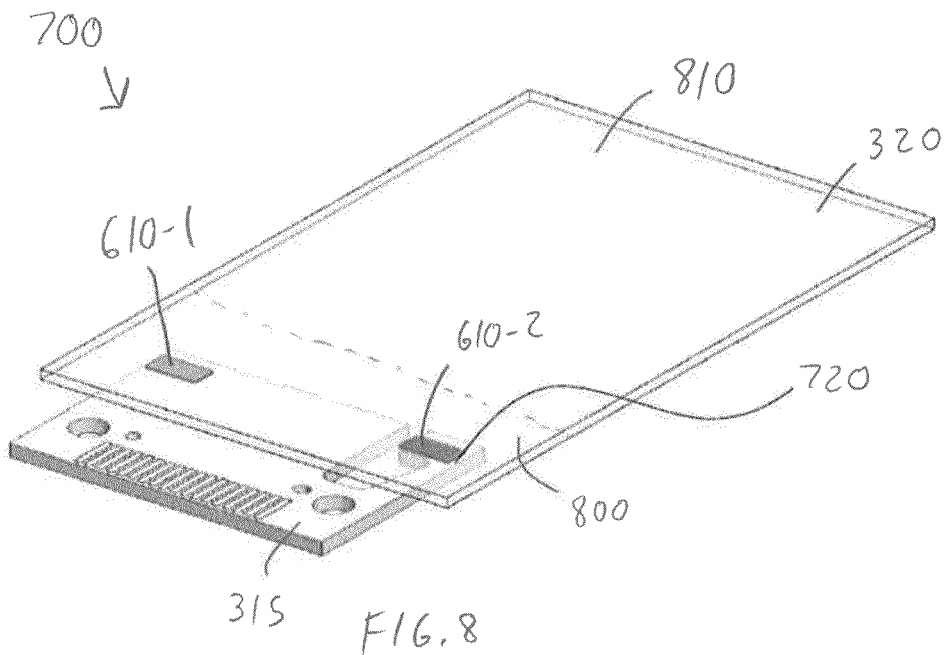
Figure 9:
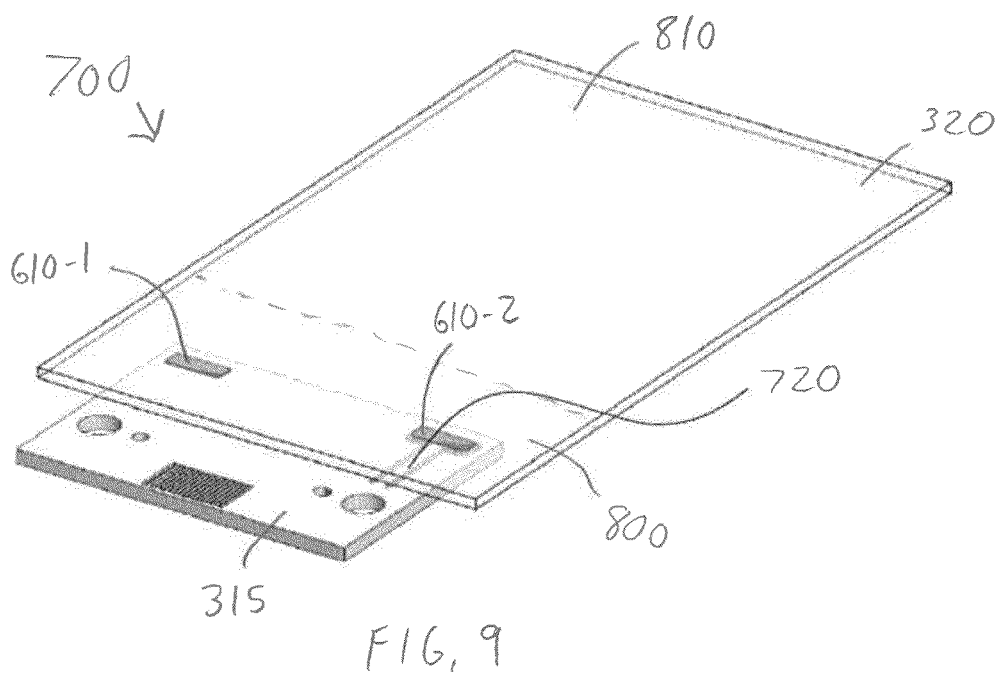

As shown in FIG. 7, and as also shown in FIGS. 8 and 9, the alignment and sizes of the relief trenches 710 may vary and may thus form a variety of differently sized and shaped reliefs 720 upon which compliant joining elements 610-2 are formed. FIGS. 8 and 9 also schematically depict an in-coupling region 800 and an out-coupling region 810 of the waveguide 320. Typically light emitted by an LED die 305 is in-coupled into the waveguide 320 in the in-coupling region 800, as shown in more detail and described in reference to FIGS. 3-5, and light is not emitted from the waveguide 320 in in-coupling region 800. At least a portion (or even all) of the in-coupling region 800 may be covered by an absorber 355, as shown in FIG. 3. The in-coupled light propagates within the waveguide 320 and is subsequently out-coupled (i.e., emitted) from, e.g., the top surface of the waveguide 320 in the out-coupling region 810.

Illumination apparatuses in accordance with embodiments of the present invention may also incorporate one or more phosphors or other photoluminescent materials as described in U.S. patent application Ser. No. 13/255,113, filed Sep. 7, 2011, the entire disclosure of which is incorporated by reference herein.

The terms and expressions employed herein are used as terms and expressions of description and not of limitation, and there is no intention, in the use of such terms and expressions, of excluding any equivalents of the features shown and described or portions thereof. In addition, having described certain embodiments of the invention, it will be apparent to those of ordinary skill in the art that other embodiments incorporating the concepts disclosed herein may be used without departing from the spirit and scope of the invention. Accordingly, the described embodiments are to be considered in all respects as only illustrative and not restrictive.

What is claimed is:

1. An illumination device comprising:
   a waveguide;
   a sub-assembly attached to a first surface of the waveguide only at a plurality of discrete attachment points, an air gap separating the first surface of the waveguide and the sub-assembly between the plurality of discrete attachment points; and
   a bare-die light-emitting diode (LED) mechanically coupled to the sub-assembly and disposed within the waveguide, light emitted by the bare-die LED being in-coupled into the waveguide.

2. The illumination device of claim 1, further comprising a spacer mechanically coupling the bare-die LED to the sub-assembly and raising the bare-die LED above a top surface of the sub-assembly.

3. The illumination device of claim 1, wherein the waveguide comprises, opposite the first surface, a second surface for emitting light emitted by the bare-die LED and propagating within the waveguide.

4. The illumination device of claim 3, wherein the first and second surfaces are substantially planar.

5. The illumination device of claim 1, wherein the waveguide comprises, adjoining and not parallel to the first surface, a second surface for emitting light emitted by the bare-die LED and propagating within the waveguide.

6. The illumination device of claim 5, wherein the first and second surfaces are substantially perpendicular to each other.

7. The illumination device of claim 1, further comprising, disposed in the waveguide above the bare-die LED, an in-coupling element for converting light emitted by the bare-die LED from an unconfined mode to a confined mode.

8. The illumination device of claim 7, wherein the in-coupling element comprises at least one of a reflector, a prism, or one or more scattering elements.

9. The illumination device of claim 1, further comprising, disposed over a second surface of the waveguide opposite the first surface, a substantially opaque absorber for blocking the propagation of light therethrough.

10. The illumination device of claim 9, wherein the absorber is attached to the second surface of the waveguide only at a second plurality of discrete attachment points, an air gap being disposed between the second surface of the waveguide and the absorber between the second plurality of discrete attachment points.

11. The illumination device of claim 1, further comprising an adhesive material disposed at each of the plurality of discrete attachment points.

12. The illumination device of claim 11, wherein the adhesive is flexible.

13. The illumination device of claim 1, wherein the waveguide defines a plurality of protrusions from the first surface, each of the protrusions being disposed at one of the discrete attachment points, a maximum height of the protrusions above the first surface being approximately equal to a thickness of the air gap.

14. The illumination device of claim 1, further comprising a plurality of discrete separators disposed between the first surface and the sub-assembly, each of the separators being disposed at one of the discrete attachment points, a thickness of the separators being approximately equal to a thickness of the air gap.

15. The illumination device of claim 14, wherein each separator is attached to the first surface and to the sub-assembly with an adhesive material.

16. The illumination device of claim 1, wherein at least one discrete attachment point is disposed on a relief defined by at least one relief trench extending through a thickness of the sub-assembly, the relief being elastically deformable in at least a first direction substantially perpendicular to the first surface.

17. The illumination device of claim 16, wherein the relief is elastically deformable in a second direction substantially perpendicular to the first direction.

18. The illumination device of claim 16, wherein at least one discrete attachment point is not disposed on a relief and thereby is not elastically deformable.

19. The illumination device of claim 1, wherein the plurality of discrete attachment points are disposed in a line substantially perpendicular to a propagation direction extending from the bare-die LED to an output region of the waveguide.

20. The illumination device of claim 1, wherein the waveguide defines a recess in the first surface, and the bare-die LED is disposed within the recess,
further comprising at least one index-matching material filling at least a portion of the recess and encapsulating the bare-die LED, thereby facilitating in-coupling of light emitted by the bare-die LED into the waveguide.

21. The illumination device of claim 20, wherein a free surface of at least one said index-matching material in the recess is spaced away from the sub-assembly, thereby defining a second air gap between the sub-assembly and the free surface.

22. The illumination device of claim 21, wherein the free surface of the at least one index-matching material is substantially parallel to the first surface of the waveguide.

23. The illumination device of claim 20, wherein, in a propagation direction extending from the bare-die LED to an output region of the waveguide, a dimension of the recess is no more than three times a dimension of the bare-die LED in the propagation direction.

24. The illumination device of claim 23, wherein the dimension of the recess in the propagation direction is no more than two times the dimension of the bare-die LED in the propagation direction.

25. The illumination device of claim 24, wherein the dimension of the recess in the propagation direction is approximately equal to the dimension of the bare-die LED in the propagation direction.

26. A method of forming an illumination device incorporating a bare-die light-emitting diode (LED) mechanically coupled to a sub-assembly, the method comprising:
attaching the sub-assembly to a first surface of a waveguide at only a plurality of discrete attachment points, thereby defining an air gap disposed between the first surface of the waveguide and the sub-assembly between the plurality of discrete attachment points; and
encapsulating the bare-die LED within a recess defined by the waveguide in the first surface, thereby facilitating in-coupling of light emitted by the bare-die LED into the waveguide.

27. The method of claim 26, wherein encapsulating the bare-die LED comprises at least partially surrounding the bare-die LED with at least one index-matching material.

28. The method of claim 27, wherein at least one said index-matching material is disposed within the recess before the sub-assembly is attached to the first surface of the waveguide.

29. The method of claim 26, wherein encapsulating the bare-die LED comprises:
at least partially surrounding the bare-die LED with a first index-matching material prior to attachment of the sub-assembly to the first surface of the waveguide;
disposing a second index-matching material within the recess prior to attachment of the sub-assembly to the first surface of the waveguide; and
at least partially surrounding the bare-die LED and a portion of the first index-matching material with the second index-matching material during attachment of the sub-assembly to the first surface of the waveguide.

30. The method of claim 26, wherein at least one discrete attachment point is disposed on a relief defined by at least one relief trench extending through a thickness of the sub-assembly, the relief being elastically deformable in at least a first direction substantially perpendicular to the first surface.

31. The method of claim 30, wherein at least one discrete attachment point is not disposed on a relief and thereby is not elastically deformable.

32. The method of claim 26, wherein attaching the sub-assembly to the first surface of the waveguide comprises forming the plurality of discrete attachment points via dispersal of an adhesive between the sub-assembly and the waveguide at each of the discrete attachment points.

33. A method of forming an illumination device incorporating a bare-die light-emitting diode (LED), the method comprising encapsulating the bare-die LED within a waveguide by disposing the bare-die LED within a waveguide material such that the waveguide material directly contacts, without a gap therebetween, the bare-die LED or an index-matching material disposed around and in direct contact with the bare-die LED.

34. The method of claim 33, further comprising attaching a sub-assembly to a first surface of the waveguide at only a plurality of discrete attachment points, thereby defining an air gap disposed between the first surface of the waveguide and the sub-assembly between the plurality of discrete attachment points.

35. The method of claim 34, wherein the waveguide defines a plurality of protrusions from the first surface, each of the protrusions being disposed at one of the discrete attachment points, a maximum height of the protrusions above the first surface being approximately equal to a thickness of the air gap.

36. The method of claim 34, wherein, substantially simultaneously, (i) the waveguide and the sub-assembly are brought into contact at the plurality of discrete attachment points, and (ii) the bare-die LED is encapsulated within the waveguide.

37. The method of claim 33, wherein at least one discrete attachment point is disposed on a relief defined by at least one relief trench extending through a thickness of the sub-assembly, the relief being elastically deformable in at least a first direction substantially perpendicular to the first surface.

38. The method of claim 37, wherein at least one discrete attachment point is not disposed on a relief and thereby is not elastically deformable.

39. The method of claim 33, wherein the bare-die LED is encapsulated substantially simultaneously with formation of the waveguide.

40. The method of claim 33, further comprising disposing the index-matching material around the bare-die LED prior to encapsulating the bare-die LED within the waveguide.

* * * * *